United States Patent
Luo et al.

(10) Patent No.: US 7,674,697 B2
(45) Date of Patent: Mar. 9, 2010

(54) MOSFET WITH MULTIPLE FULLY SILICIDED GATE AND METHOD FOR MAKING THE SAME

(75) Inventors: Zhijiong Luo, Carmel, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 926 days.

(21) Appl. No.: 11/160,698

(22) Filed: Jul. 6, 2005

(65) Prior Publication Data

US 2007/0010081 A1    Jan. 11, 2007

(51) Int. Cl.
 H01L 21/3205    (2006.01)
 H01L 21/4763    (2006.01)
(52) U.S. Cl. .................. 438/585; 438/142; 438/197; 438/199
(58) Field of Classification Search .................. 438/163, 438/199, 142, 197; 257/E21.165, E21.203
See application file for complete search history.

(56) References Cited

U.S. PATENT DOCUMENTS

| | | | | |
|---|---|---|---|---|
| 5,920,783 A | * | 7/1999 | Tseng et al. | ................ 438/305 |
| 6,329,252 B1 | * | 12/2001 | Lin | ............................ 438/279 |
| 6,538,295 B1 | | 3/2003 | Bronner et al. | |
| 6,562,718 B1 | * | 5/2003 | Xiang et al. | ................ 438/682 |
| 6,914,309 B2 | * | 7/2005 | Koga | .......................... 257/382 |
| 7,101,766 B2 | * | 9/2006 | Jung | ......................... 438/304 |
| 2005/0070062 A1 | * | 3/2005 | Visokay et al. | .............. 438/236 |
| 2005/0272235 A1 | * | 12/2005 | Wu et al. | .................... 438/592 |

\* cited by examiner

*Primary Examiner*—Thao X Le
*Assistant Examiner*—Eric W Jones
(74) *Attorney, Agent, or Firm*—Yuanmin Cai

(57) ABSTRACT

A process is described for forming a fully multiple silicided gate for complementary MOSFET (CMOS) devices. A silicidation process is performed on a gate structure, which includes a gate material overlying a gate dielectric disposed on a substrate. A layer of insulating material is formed which covers the gate structure; the thickness of this layer is less at sidewalls of the gate structure than on a top surface of the gate structure. A portion of the layer of insulating material is then removed, so that the sidewalls of the gate structure are exposed. A layer of metal is formed which covers the gate structure so that the metal is in contact with the sidewalls of the gate structure. The silicidation process is then performed, in which a metal silicide is formed from the gate material and the metal; the gate material is thereby fully silicided.

14 Claims, 4 Drawing Sheets

MOSFET WITH MULTIPLE FULLY SILICIDED GATE AND METHOD FOR MAKING THE SAME

FIELD OF THE INVENTION

This invention relates to the manufacturing of advanced complementary MOSFET (CMOS) devices. More particularly, the invention relates to formation of fully silicided metal gate structures in such devices.

BACKGROUND OF THE INVENTION

The use of metal silicide layers in CMOS devices offers several advantages in device performance. For example, in a gate structure 10 as shown in FIG. 1, a portion of the gate material 15 immediately above the gate dielectric 13 may be replaced by a silicide material. More recently, advanced devices have been produced with fully silicided gates; that is, the entire gate structure above the gate dielectric is replaced by a silicide material. In a typical gate structure made of polysilicon, this involves covering the polysilicon with a blanket layer of metal and performing a silicidation process (details of which are known to those skilled in the art). To achieve full silicidation of all the gate structures on a wafer, a high degree of uniformity is required in the height of the gate structures. The gate structure height is typically controlled by planarization (chemical mechanical polishing or CMP) and/or an etchback process. However, CMP and etchback processes present manufacturing difficulties, particularly when the CMOS devices are being produced on large wafers (e.g. 300 mm diameter). These processes cannot provide the required cross-wafer polysilicon height uniformity; this leads to low quality of the silicided gates and low device yields. In addition, the conventional fully-silicided gate formation process requires many more process steps in comparison to the process for making standard polysilicon CMOS gates.

Accordingly, there is a need for a process which provides fully silicided CMOS gate structures while avoiding the uniformity problem associated with current techniques. In addition, it is desirable that the process have fewer steps than are used at present.

SUMMARY OF THE INVENTION

The present invention addresses the above-described need for providing a simplified process for forming a fully multiple silicided gate, in which cross-wafer CMP and etchback of the gate structure are avoided. In accordance with the present invention, this is done by performing a silicidation process on a gate structure, which includes a gate material overlying a gate dielectric disposed on a substrate. (Such gate structures generally have a small gate length, usually less than 100 nm.) A layer of insulating material is formed which covers the gate structure; the thickness of this layer is less at sidewalls of the gate structure than on a top surface of the gate structure. A portion of the layer of insulating material is then removed, so that the sidewalls of the gate structure are exposed while the top of the gate structure and the source and drain regions are still covered by insulating material. A layer of metal is formed which covers the gate structure so that the metal is in contact with the sidewalls of the gate structure. A silicidation process is then performed, in which a metal silicide is formed from the gate material and the metal; the gate material is thereby fully silicided. A first silicidation process may also be performed, in which a silicide is formed in upper portions of the source and drain regions, and in an upper portion of the gate structure. The silicide in the source and drain regions is separated from the metal layer by the insulating layer.

According to another aspect of the invention, a gate structure is provided which includes a fully silicided gate material overlying a gate dielectric disposed on a substrate. The fully silicided gate material generally has a top region, a middle region and a bottom region, wherein the bottom region and the top region each have a width in accordance with a width of the gate dielectric, and the middle region has a width greater than that of the top and bottom regions. The silicide material in the top region (first silicide) may be different from the silicide material in the middle and bottom regions (second silicide). In most cases the middle region is wider than the top and bottom regions, so that the multiple fully silicided gate structure has a cross shape. For certain silicide materials, the middle region may have the same width or a smaller width compared to the bottom region and top region.

DETAILED DESCRIPTION OF A PREFERRED EMBODIMENT OF THE INVENTION

Figure 1:
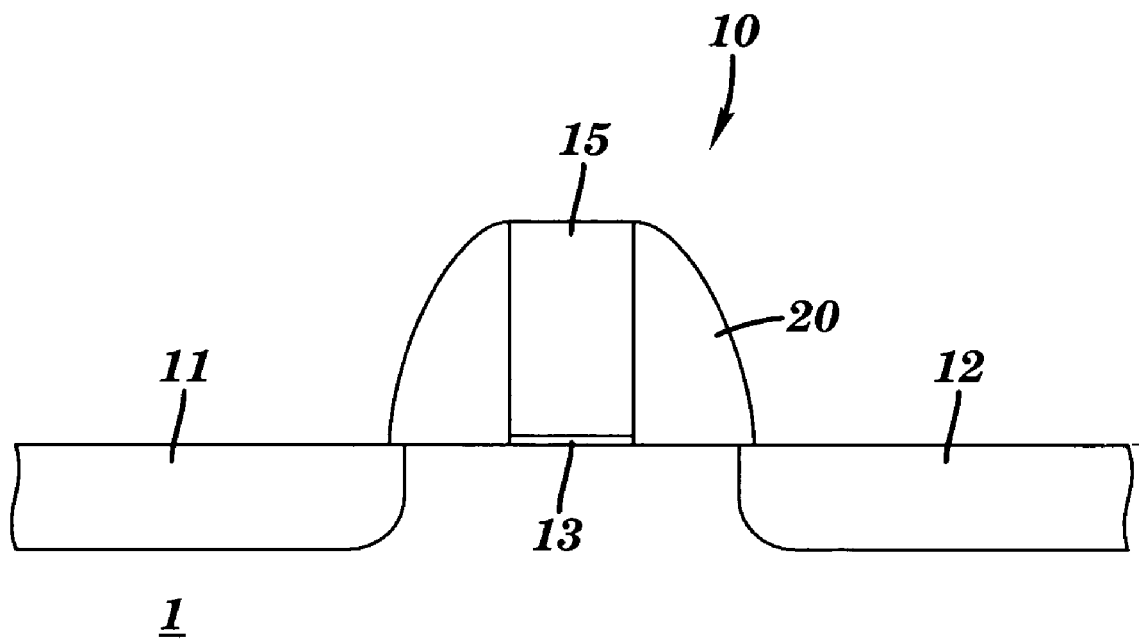
FIG. 1 schematically illustrates a typical CMOS transistor having a source, drain, gate and spacers adjacent to the gate.
Figure 2:
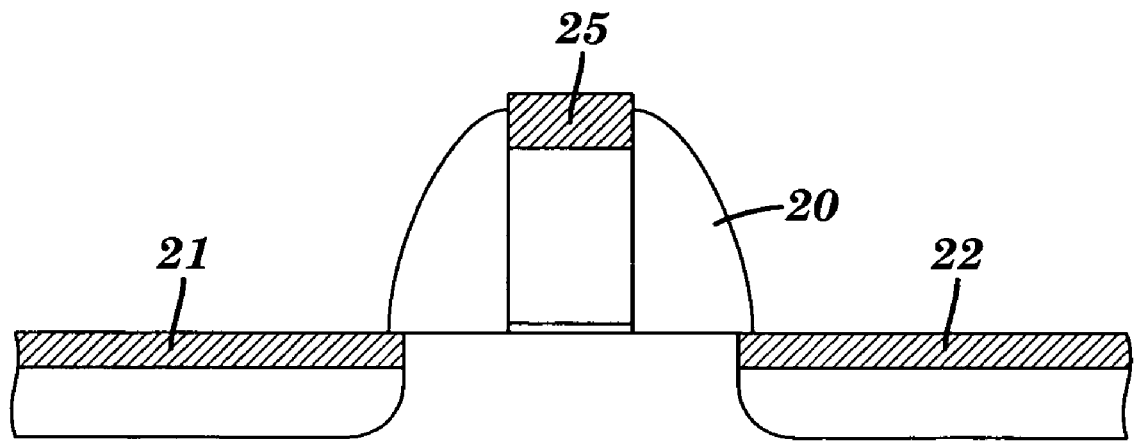
FIG. 2 shows the CMOS transistor of FIG. 1, after a first silicidation process.

A conventional CMOS transistor, as shown in FIG. 1, has a gate structure 10 formed on the surface of a substrate 1, with source/drain regions 11, 12 formed in the substrate. The gate structure includes a gate dielectric 13 on the substrate surface, and a gate conductor 15 (polysilicon in this embodiment) over the gate dielectric. Spacers 20, typically of nitride, serve to define the distance between the source/drain regions and the gate. A conventional silicidation process is then performed, to form layers of silicide 21, 22 in the source and drain regions, and a silicide region 25 at the top of the gate (FIG. 2). It is typical for the silicided regions to expand in volume due to the silicidation process; region 25 is therefore shown extending above spacers 20. Depending on the metal used in the silicidation process, the silicide in regions 21, 22, 25 may be CoSi, NiSi, PtSi, etc. This silicide must be compatible with the thermal budget of the second silicide process described below.

Figure 3:
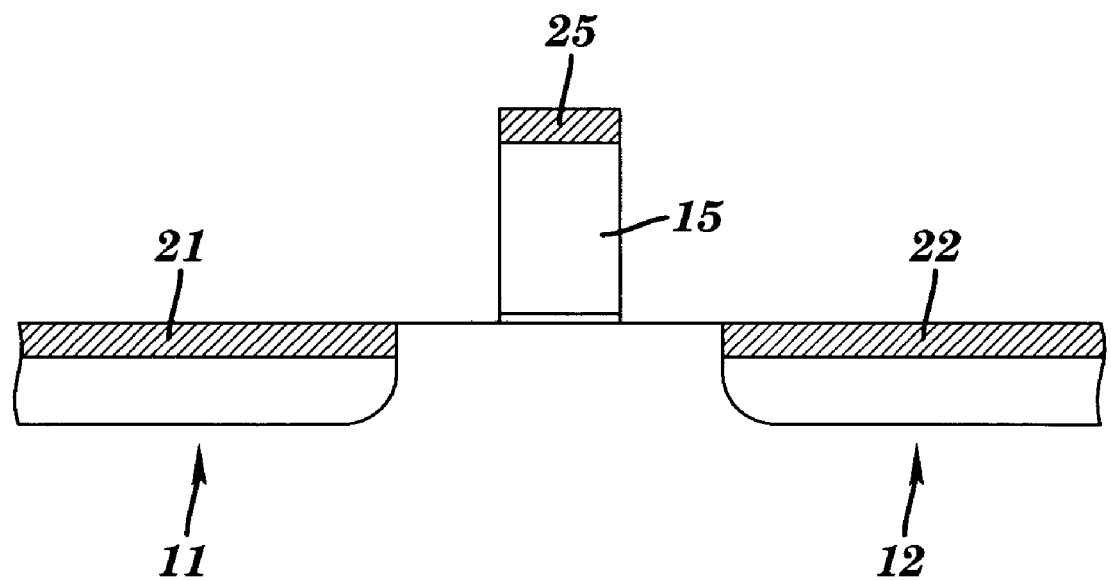
FIGS. 3-7 illustrate steps in the formation of a fully multiple silicided gate, in accordance with an embodiment of the invention.

The process of forming a second silicide, so that a fully multiple silicided gate is produced, begins with removing the spacers 20. This may be done by any one of a variety of isotropic nitride etch processes that are selective with respect to silicon, silicide and polysilicon, including both wet and dry processes. The resulting structure is shown in FIG. 3.

Figure 4:
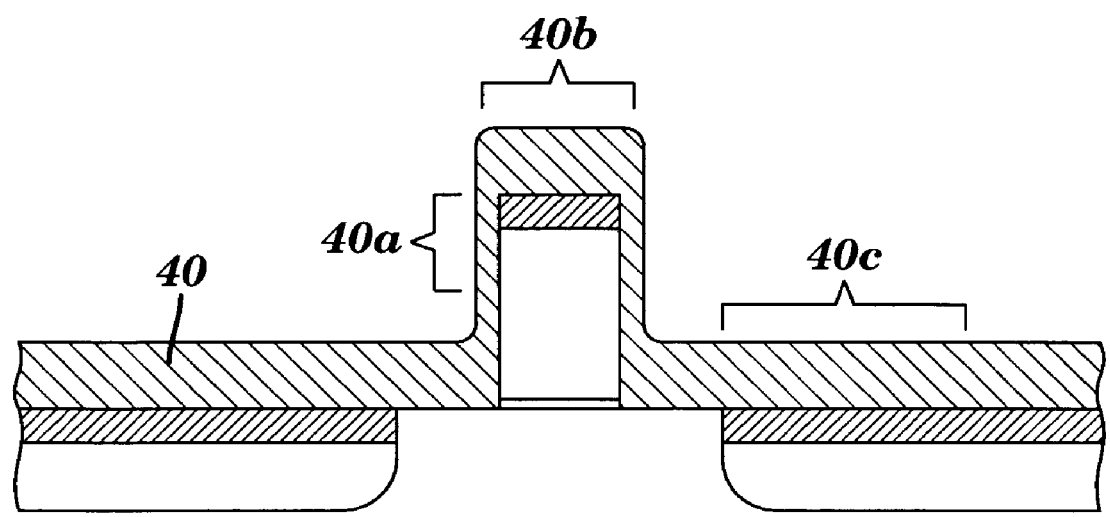
Figure 5:
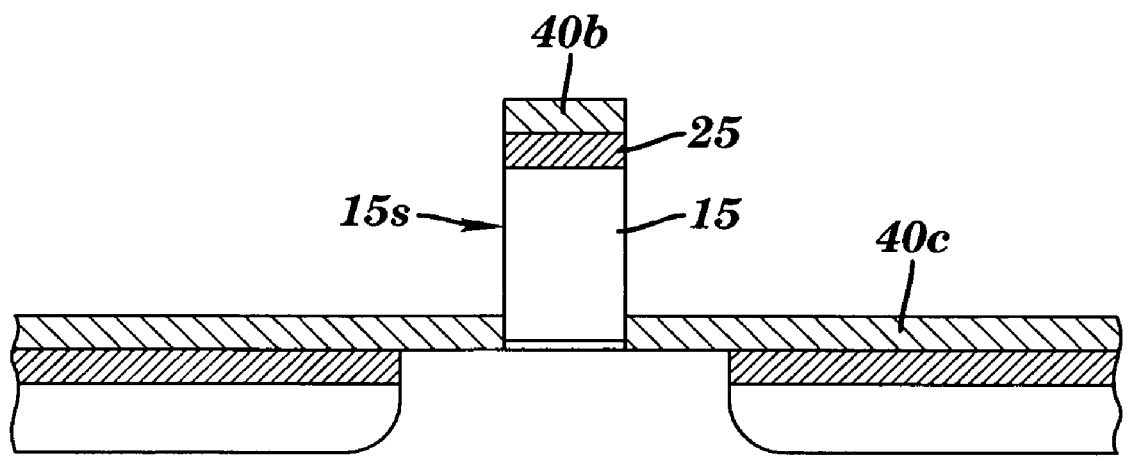

A layer 40 of insulating material (e.g. oxide or nitride) is then deposited as a non-conformal blanket layer in a deposition process, preferably a high-density plasma process (HDP) or plasma-enhanced chemical vapor deposition (PECVD). It should be noted that in a PECVD or HDP deposition process for oxide or nitride, it is typical for layer 40 to be non-conformal; that is, the portion 40a of the layer overlying the sidewall of the gate is thinner than portions 40b on top of the gate and 40c overlying the source/drain regions (see FIG. 4). This in turn causes portion 40a to be removed (thereby exposing the sidewall 15s of gate polysilicon 15) when an isotropic etchback process is subsequently performed, while portions 40b and 40c are reduced in thickness (see FIG. 5). The isotropic etchback process may be either a wet or dry process.

Figure 6:
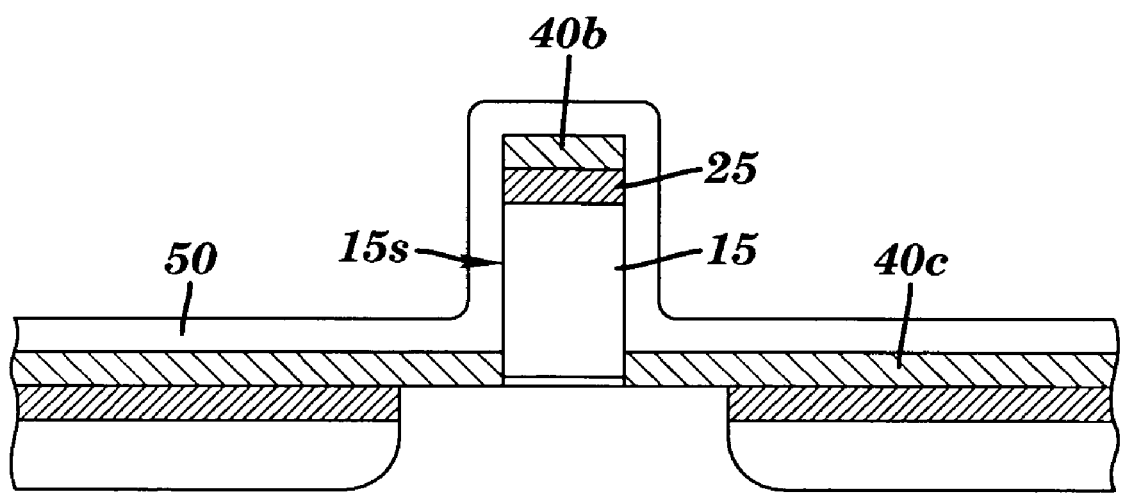

A layer 50 of metal is then deposited (e.g. Co, Ni, Pt, etc. deposited by sputtering or by evaporation) as a blanket layer, as shown in FIG. 6. It should be noted that metal layer 50 is in contact with the gate conductor 15 at the sidewalls 15s thereof, and is separated from the source/drain regions by the remainder 40c of layer 40.

Figure 7:
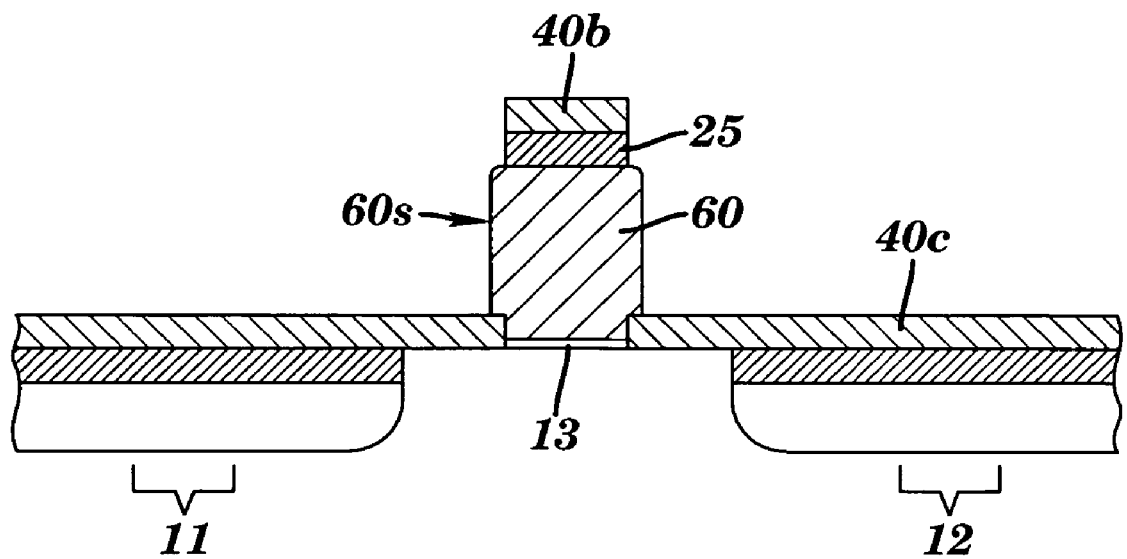

A second silicidation process is then performed, in which the remainder of the polysilicon material 15 in the gate is converted to a metal silicide 60. The resulting structure is shown in FIG. 7. Due to the volume change of the silicided region in the silicidation process, the gate silicide 60 will generally have a width different from that of the original polysilicon gate. In this embodiment, the silicide expands with respect to the original gate material; the gate silicide 60 has a greater width and thus overhangs the gate dielectric 13, as shown in FIG. 7. Since the first silicidation was performed with the spacers were still in place, the metal silicide 60 is also wider than the first silicide region 25. The multiple fully silicided gate (that is, the gate structure comprising multiple silicide regions 25 and 60) therefore has a cross shape, with the silicide 60 extending laterally so that the sidewalls 60s overhang the gate dielectric 13 while the first silicide region 25 and the bottom portion of the metal silicide 60 have widths approximately equal to that of the gate dielectric 13.

Figure 8:
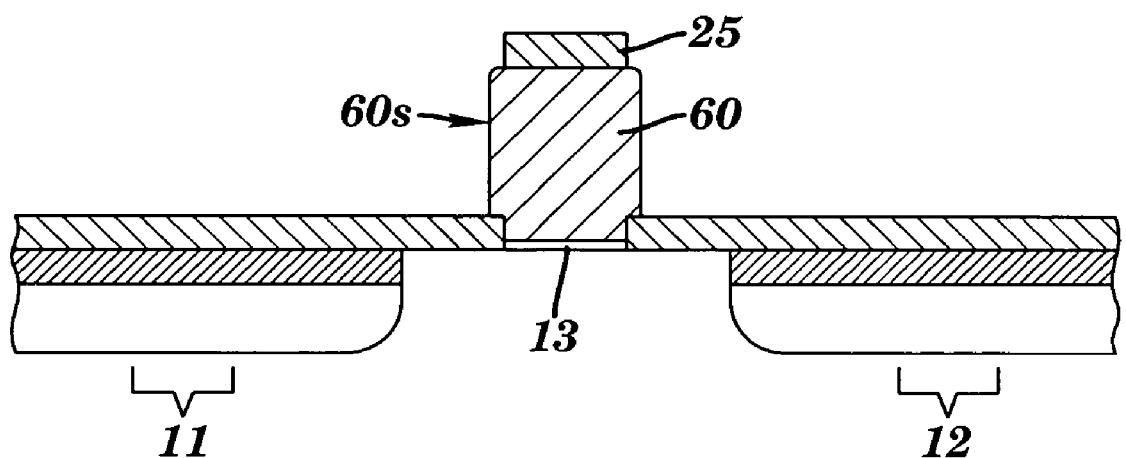
FIG. 8 illustrates a CMOS transistor having a fully multiple silicided gate structure, formed in accordance with an embodiment of the invention.

The remaining portions 40b, 40c of the insulating layer are then removed by any convenient process, so that the completed multiple fully silicided gate appears as shown in FIG. 8. It should be noted that the first silicide (in regions 21, 22, 25) and the second silicide 60 are generally different materials, and are chosen to adjust different characteristics of the device. For example, the first silicide may be used to reduce defects such as silicide pipes, while the second silicide is used to adjust the transition voltage $V_t$ and to provide appropriate stress.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method for making a field-effect transistor, comprising the steps of:
   providing a gate structure including a gate material overlying a gate dielectric disposed on a substrate;
   forming a layer of insulating material covering the gate structure, a thickness of the layer of insulating material being less at sidewalls of the gate structure than on a top surface of the gate structure;
   removing a portion of the layer of insulating material so that the sidewalls of the gate structure are exposed while at the same time leaving the top surface of the gate structure being covered by the layer of insulating material;
   forming a layer of metal covering the gate structure and on top of the layer of insulating material remaining on top of the gate structure so that the metal is in contact with the sidewalls of the gate structure; and
   performing a silicidation process in which a metal silicide is formed from the gate material and the metal, the gate material thereby being fully silicided.

2. A method according to claim 1, further comprising the step, before said step of forming the layer of insulating material, of
   performing a first silicidation process to form a first silicide in an upper portion of the gate structure.

3. A method according to claim 2, wherein said metal silicide is characterized as a second silicide and is formed from material in a lower portion of the gate structure, so that the first silicide overlies the second silicide and is in contact therewith.

4. A method according to claim 2, wherein said metal silicide is characterized as a second silicide different from the first silicide, so that a multiple fully silicided gate is formed.

5. A method according to claim 2, wherein the transistor includes a source region and a drain region, and in the first silicidation process a silicide is formed in an upper portion of the source region and drain region respectively.

6. A method according to claim 5, wherein the layer of insulating material covers the silicide formed in the source and drain regions, so that the layer of metal is separated therefrom.

7. A method according to claim 2, wherein removing the portion of the layer of insulating material exposes at least a portion of the sidewalls of the gate structure that are not silicided.

8. A method according to claim 2, wherein said metal silicide is characterized as a second silicide and is formed with a lateral extent different from that of the first silicide.

9. A method according to claim 2, wherein said metal silicide is characterized as a second silicide and is formed with a lateral extent greater than that of the first silicide, so that the second silicide overhangs the first silicide.

10. A method according to claim 1, wherein in said silicidation process the metal silicide is formed with a lateral extent different from that of the gate dielectric.

11. A method according to claim 1, wherein in said silicidation process the metal silicide is formed with a lateral extent greater than that of the gate dielectric, so that the metal silicide overhangs the gate dielectric.

12. A method according to claim 1, wherein the layer of insulating material is one of oxide and nitride and is formed as a non-conformal layer covering the gate structure.

13. A method according to claim 1, wherein the layer of insulating material is one of oxide and nitride and is formed by one of a PECVD process and an HDP process, so that a non-conformal layer is formed covering the gate structure.

14. A method according to claim 1, further comprising the step of removing a remaining portion of the layer of insulating material.

* * * * *